(12) United States Patent
He et al.

(10) Patent No.: US 9,728,507 B2
(45) Date of Patent: Aug. 8, 2017

(54) CAP CHIP AND REROUTE LAYER FOR STACKED MICROELECTRONIC MODULE

(75) Inventors: Sambo He, Riverside, CA (US); W. Eric Boyd, Long Beach, CA (US)

(73) Assignee: PFG IP LLC, Tiburon, CA (US)

( * ) Notice: Subject to any disclaimer, the term of this patent is extended or adjusted under 35 U.S.C. 154(b) by 11 days.

(21) Appl. No.: 13/549,695

(22) Filed: Jul. 16, 2012

(65) Prior Publication Data

US 2013/0020572 A1 Jan. 24, 2013

Related U.S. Application Data

(60) Provisional application No. 61/509,308, filed on Jul. 19, 2011.

(51) Int. Cl.
| | | |
|---|---|---|
| H01L 27/32 | (2006.01) | |
| H01L 23/538 | (2006.01) | |
| H01L 23/498 | (2006.01) | |
| H01L 21/48 | (2006.01) | |
| H05K 1/02 | (2006.01) | |
| H05K 3/46 | (2006.01) | |
| H01L 23/00 | (2006.01) | |
| H05K 1/18 | (2006.01) | |

(52) U.S. Cl.
CPC ........ *H01L 23/5389* (2013.01); *H01L 21/486* (2013.01); *H01L 23/49822* (2013.01); *H01L 23/49827* (2013.01); *H05K 1/0275* (2013.01); *H05K 3/4602* (2013.01); *H01L 24/16* (2013.01); *H01L 24/48* (2013.01); *H01L 24/73* (2013.01); *H01L 2224/16237* (2013.01); *H01L 2224/32225* (2013.01); *H01L 2224/48227* (2013.01); *H01L 2224/48228* (2013.01); *H01L 2224/73265* (2013.01); *H01L 2924/00014* (2013.01); *H01L 2924/30107* (2013.01); *H05K 1/186* (2013.01); *H05K 3/4647* (2013.01)

(58) Field of Classification Search
None
See application file for complete search history.

(56) References Cited

U.S. PATENT DOCUMENTS

| | | | | |
|---|---|---|---|---|
| 5,817,540 A | * | 10/1998 | Wark ................ | H01L 23/4951 257/E23.039 |
| 6,181,569 B1 | * | 1/2001 | Chakravorty ....... | H01L 23/3114 228/122.1 |
| 2002/0084528 A1 | * | 7/2002 | Kim .................... | H01L 23/3157 257/773 |
| 2003/0164551 A1 | * | 9/2003 | Lee ...................... | H01L 21/563 257/778 |

(Continued)

*Primary Examiner* — Michael Lebentritt
(74) *Attorney, Agent, or Firm* — Thomas M. Freiburger

(57) ABSTRACT

A cap chip or high density reroute layer for use in a stacked microelectronic module. A first set of electrically conductive reroute layers are defined on a sacrificial substrate. One or more stud bump columns are defined on an exposed conductive pad on a conductive reroute layer. One or more active or passive electronic elements, or both may be electrically coupled to one or more exposed conductive pads. The layer is encapsulated in an encapsulant and the stud bump columns exposed by removing a portion of the encapsulant. A second set of electrically conductive reroute layers is defined on the layer and electrically coupled to the stud bumps. The sacrificial substrate is removed to provide a cap chip or reroute layer.

11 Claims, 3 Drawing Sheets

(56) References Cited

U.S. PATENT DOCUMENTS

| | | | |
|---|---|---|---|
| 2004/0042190 A1* | 3/2004 | Eng | H01L 21/4857 361/795 |
| 2005/0006748 A1* | 1/2005 | Eng | H01L 21/4857 257/690 |
| 2005/0121770 A1* | 6/2005 | Baek | H01L 23/5227 257/698 |
| 2005/0224968 A1* | 10/2005 | Ho | H01L 24/97 257/737 |
| 2007/0035033 A1* | 2/2007 | Ozguz | H01L 21/4803 257/777 |
| 2009/0091333 A1* | 4/2009 | Chung | H01L 22/22 324/538 |
| 2010/0224978 A1* | 9/2010 | Shim | H01L 23/49816 257/686 |
| 2011/0085304 A1* | 4/2011 | Bindrup | H01L 21/4871 361/718 |
| 2011/0204505 A1* | 8/2011 | Pagaila | H01L 21/568 257/686 |
| 2012/0074579 A1* | 3/2012 | Su | H01L 21/76898 257/774 |
| 2012/0211886 A1* | 8/2012 | Lieu | H01L 24/19 257/737 |
| 2012/0252168 A1* | 10/2012 | Nah | H01L 21/563 438/124 |
| 2013/0037964 A1* | 2/2013 | Lee | H01L 23/481 257/774 |
| 2013/0127018 A1* | 5/2013 | Phua | H01L 24/96 257/620 |
| 2013/0337615 A1* | 12/2013 | Xu | H01L 21/02112 438/125 |
| 2015/0108635 A1* | 4/2015 | Liang | H01L 28/10 257/737 |
| 2016/0126173 A1* | 5/2016 | Kim | H01L 23/498 257/738 |

\* cited by examiner

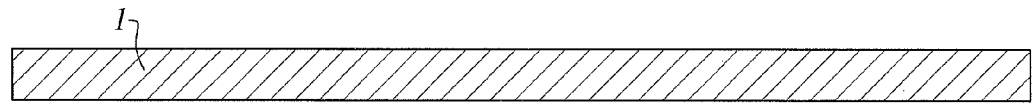
*Fig. 2A*
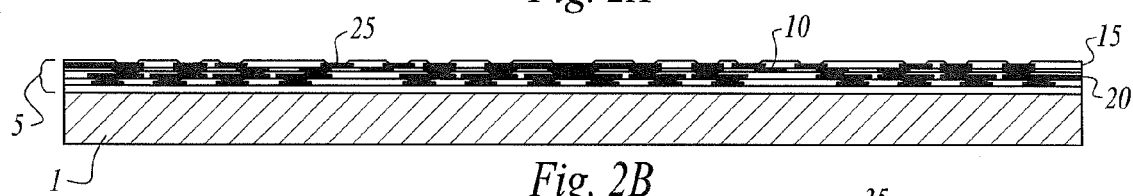
*Fig. 2B*
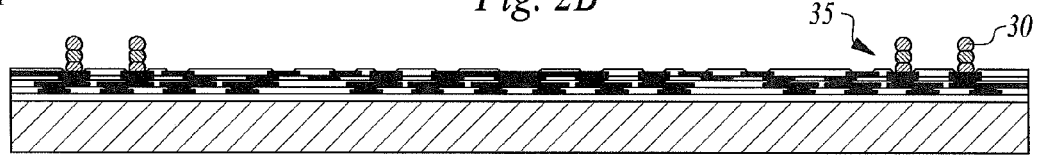
*Fig. 2C*
*Fig. 2D*
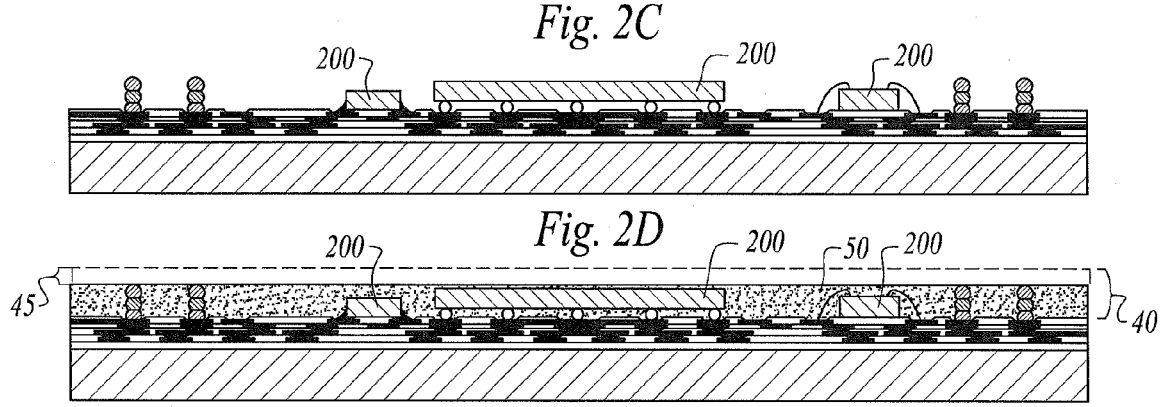
*Fig. 2E*
*Fig. 2F*
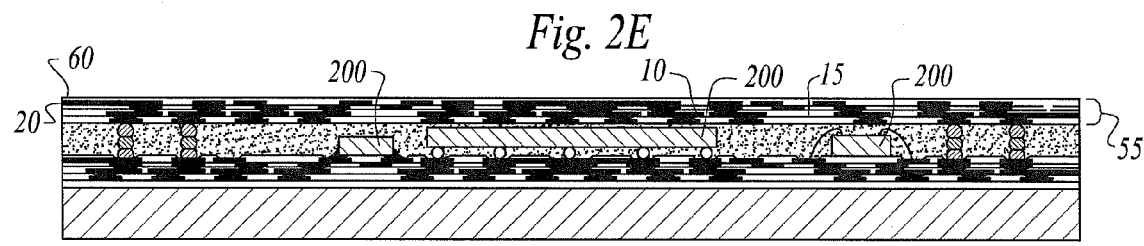
*Fig. 2G*
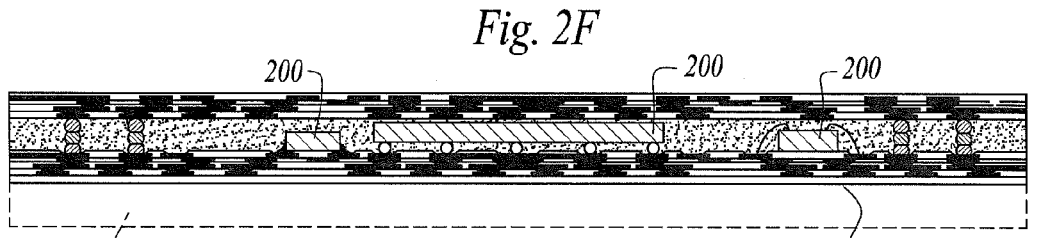
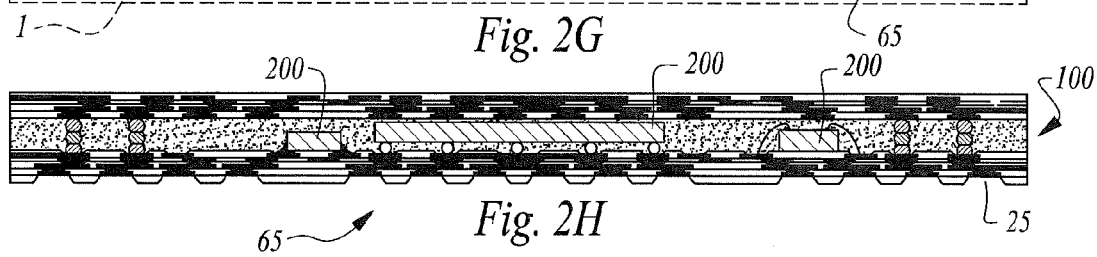
*Fig. 2H*

CAP CHIP AND REROUTE LAYER FOR STACKED MICROELECTRONIC MODULE

CROSS-REFERENCE TO RELATED APPLICATIONS

This application claims the benefit of U.S. Provisional Patent Application No. 61/509,308, filed on Jul. 19, 2011 entitled "Cap Chip for Integrated Circuit Chip Stack" pursuant to 35 USC 119, which application is incorporated fully herein by reference.

STATEMENT REGARDING FEDERALLY SPONSORED RESEARCH AND DEVELOPMENT

N/A

BACKGROUND OF THE INVENTION

1. Field of the Invention

The invention relates generally to the field of integrated circuit interconnection devices and methods.

More specifically, the invention relates to an interface board, high density reroute layer or "cap chip" for applications requiring a larger number of electrical interconnects spaced closely together such as used in an interconnected stack of integrated circuit chips in the form of a multilayer electronic module.

2. Description of the Related Art

By way of background, the U.S. Patents cited below disclose inventions wherein layers containing integrated circuits chips are stacked and electrically coupled or interconnected using any of a number of stacking techniques known to those skilled in the art. For example, Irvine Sensors Corporation, now ISC8 Inc., assignee of the instant application, has developed several patented techniques and devices for stacking and interconnecting multiple integrated circuits. Some of these techniques and devices are disclosed in U.S. Pat. Nos. 4,525,921; 4,551,629; 4,646,128; 4,706, 166; 5,104,820; 5,347,428; 5,432,729; 5,688,721; 5,953, 588; 6,117,704; 6,560,109; 6,706,971; 6,717,061; 6,734, 370; 6,806,559 and 8,074,082.

This invention relates to the fabrication of three-dimensional electronic packages in which a multiplicity of individual integrated circuit (IC) chips are secured together in a stack which provides a very high density electronic package.

As stated in U.S. Pat. No. 5,279,991, which provides more detailed disclosure of certain process steps, the assignee of this application pioneered the use of IC chip stacks; first as modules providing photo-detector focal plane circuitry and then as units suitable for computer memories and the like. U.S. Pat. Nos. 4,525,921 and 4,646,128 relate to the stacks designed for general use as memory devices and other non-focal-plane packages.

One problem, which applies to stacks used as memory devices and also to other non-focal-plane packages, is the difficulty of connecting exterior circuitry to the large number of conductors on the lateral surfaces, i.e., access planes of the completed stack. Focal plane chip stack modules incorporate multiplexer circuitry, which greatly reduces the number of module output connections. However, providing output connections for memory devices and other non-multiplexed devices is a much greater challenge.

There are two acknowledged orientations which represent the structural relationship of the stacked IC chips in a module to the lead-out or I/O layer, which makes outside electrical circuitry available for connection to the multiplicity of electrical leads (terminals) which are formed on the access plane face of the module, and which are electrically coupled to the IC circuitry embedded in the module.

In one arrangement, the layers of the module extend in planes perpendicular to the plane of the I/O layer. And in the other arrangement, the layers of the module extend in planes parallel to the plane of the I/O layer.

The I/O layer may be located below, above, or along the side of, the stacked chip module. The two most common configurations are described as a "sliced bread" stack, or as a "pancake" stack.

U.S. Pat. No. 4,706,166 discloses a "sliced bread" stack in which the IC chips in the stacked module are in planes perpendicular to a stack-supporting I/O layer. The I/O layer carries electrical conductors, which are used to connect the module to external circuitry such as a printed circuit board. The access plane of the stack faces the supporting I/O layer. The electrical connections between the stack face and I/O layer are formed by bonding aligned solder bumps on the opposing surfaces, a process is sometimes referred to as surface mount technology. In such a construction, the lead-out terminals are necessarily located very close to one another, a fact which creates difficulties in obtaining satisfactory lead-out connections.

"Pancake" stacks comprise IC chips which are in planes parallel to a supporting I/O layer. The electrical leads from the many terminals on the access plane of the stack preferably are brought either to the bottom or to the top of the stack, in order to be connected to external circuitry. An example of such a "pancake" stack is disclosed in U.S. Pat. No. 5,279,991. "Pancake" stacks, as distinguished from "sliced bread" stacks, are more likely to be used where a smaller number of IC chips are included in the stacked layer module; either because fewer chips are needed for a particular module or because of limited "headroom" i.e., limited available space in which the module is located.

The present invention deals primarily with the problem of connecting the circuitry of IC chips in pancake stacks with suitable lead-out terminals, which are then used in connecting to external circuitry.

Generally speaking, substantially planar layer elements containing integrated circuits are bonded together one on top of another so as to provide a footprint equivalent to that of the largest layer in the stack. Selected input/output connections of the integrated circuit die in the layers may be routed to the edges of the layers or to area interconnects or electrically conductive vias defined in one or more of the layers using metalized traces using a set of known photo-lithographic steps.

"T-connect" structures for interconnecting one or more layers may be defined on one or more lateral surfaces of the stacked module by electrically routing and electrically coupling the input/output connections of the ICs in the layers to the edges whereby the input/output connections are electrically accessible on the sides of the component stack in the form of a cross-sectional portion of the trace. These input/output connections are then electrically interconnected on one or more lateral surfaces of the component stack using photolithographic and conductive plating processes to create T-connects using techniques such as those described in the patents identified above.

Alternatively, electrically conductive vias may be defined at predetermined locations on one or more layers and used to electrically interconnect layers in the stack.

Advanced chip/die stacking/laminating technology often requires the use of interface boards also known as "cap chips", having internal and external electrical connections with a requirement of large numbers of closely spaced interconnections sometimes referred to as "fan-out connections. This requirement is not easily met using present printed circuit board (PCB) technology, or by other methods due to the small dimensions involved.

As earlier discussed, the die stacks use metalized conductive traces running on the side walls of the stack ("side bus") which connect to individual layer traces in the form of access leads disposed on the surface of each die. These layer traces terminate at the perimeter or edge of the layer where the cross-section of the traces is exposed prior to application of the side buses.

To connect die stacks to other devices or assemblies, side buses may be provided to terminate at an interface board or cap chip or reroute layer within which high density re-routing of contacts is achieved in order to connect to external circuitry.

It is the interface board/cap chip that this invention addresses. The invention is comprised of multiple, stacked metal bumps (called "stud bumps") from an automatic wire bonder used to create solid via contacts and uses lithography to re-route the traces within the device.

The cap chip and reroute layer of the invention may be provided to be of identical footprint dimensions as the stacked/laminated die and either of the same thickness or slightly thicker, depending on its application.

BRIEF SUMMARY OF THE INVENTION

This invention comprises an insulated end "cap" chip or a high density signal reroute layer for use in a multilayer module, which is an integral part of the stack and which provides means for interconnecting the circuitry inside the stack and with exterior circuitry. A significant result of this invention is a major increase in the real estate available for locating lead-out terminals. The term "cap chip" and "reroute layer" are used interchangeably herein since, depending on the desired end use and selected embodiment, the device may function as a cap chip, a high density reroute layer or both.

A surface of the layer has numerous terminals available for connection, by wire bonding or other suitable means, to exterior circuitry. The terminals on the surface of the cap chip or reroute layer are connected to the IC circuitry embedded in the stack by suitable conductors, e.g., electrically conductive metallic leads.

The signals from the IC chips in the stack are conveyed to the cap chip or reroute layer, using the lateral surface or surfaces of the module as the access plane of the stack as the location for signal reroute metallization. The access plane is formed by the aligned edges of the stacked chips to define a planar surface having one or more exposed conductive traces as access leads thereon. More than one access plane or lateral surface of the module may be used.

In the first aspect of the process of the invention, a process for making a cap chip or reroute layer device is provided comprising the steps of providing a sacrificial substrate comprising a substrate surface and defining a first set of electrically conductive reroute layers comprising at least one exposed electrically conductive pad on the substrate surface.

A predetermined number of wire bond stud bumps in the form of a stud bump column are electrically coupled to the exposed conductive pad. The layer is encapsulated within an encapsulation material. A predetermined portion of the encapsulation material is removed to expose a portion of the stud bump column to define a stud bump column surface.

A second set of electrically conductive reroute layers is defined and electrically coupled to the stud bump column on the stud bump column surface.

The sacrificial substrate is removed to expose a reroute layer interconnect surface, and an electrically conductive pad is exposed on the reroute layer interconnection surface for electrical coupling to external circuitry.

In a second aspect of the process of the invention, the outermost layer of the second set of electrically conductive reroute layers is a uniform dielectric layer.

In a third aspect of the process of the invention, the outermost layer of the second set of electrically conductive reroute layers comprises at least one exposed electrically conductive pad.

In a fourth aspect of the invention, the process further comprises the step of electrically coupling an electronic element to at least one of the first or second set of electrically conductive reroute layers.

In a fifth aspect of the process of the invention, a reroute layer device is disclosed prepared by a process comprising the steps of providing a sacrificial substrate comprising a substrate surface and defining a first set of electrically conductive reroute layers comprising at least one exposed electrically conductive pad on the substrate surface.

A predetermined number of wire bond stud bumps in the form of a stud bump column are electrically coupled to the exposed conductive pad. The layer is encapsulated within an encapsulation material and a predetermined portion of the encapsulation material removed to expose a portion of the stud bump column to define a stud bump column surface.

A second set of electrically conductive reroute layers is defined and electrically coupled to the stud bump column on the stud bump column surface. The sacrificial substrate is removed to expose a reroute layer interconnect surface, and an electrically conductive pad exposed on the reroute layer interconnection surface for electrical coupling to external circuitry.

In a sixth aspect of the device of the process of the invention, the outermost layer of the second set of electrically conductive reroute layers is a uniform dielectric layer.

In a seventh aspect of the device of the process of the invention, the outermost layer of the second set of electrically conductive reroute layers comprises at least one exposed electrically conductive pad.

In an eighth aspect of the device of the process of the invention, the process further comprises the step of electrically coupling an electronic element to at least one of the first or second set of electrically conductive reroute layers.

In a ninth aspect of the invention, a reroute layer device is provided comprised of a first set of electrically conductive reroute layers, a second set of electrically conductive reroute layers, and, at least one encapsulated stud bump column defined between, and electrically coupled to, the first set of electrically conductive reroute layers and the second set of electrically conductive reroute layers.

In a tenth aspect of the invention, the first and second electrically conductive reroute layers comprise an access lead defined on a lateral surface of the device for use as an element of an electrically conductive T-connect structure defined in a subsequent operation.

In an eleventh aspect of the invention, the second set of electrically conductive reroute layers is a uniform dielectric layer.

In a twelfth aspect of the invention, the outermost layer of the second set of electrically conductive reroute layers comprises at least one exposed electrically conductive pad.

In a thirteenth aspect of the invention, an electronic element is coupled to at least one of the first or second set of electrically conductive reroute layers.

In a fourteenth aspect of the invention, the electronic element is an electronic monitoring circuit.

These and various additional aspects, embodiments and advantages of the present invention will become immediately apparent to those of ordinary skill in the art upon review of the Detailed Description and any claims to follow.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

BRIEF DESCRIPTION OF THE SEVERAL VIEWS OF THE DRAWINGS

FIGS. 2A-2H depict a set of process steps for fabricating a cap chip of the invention comprising one or more electronic elements for use in a stacked microelectronic module.

The invention and its various embodiments can now be better understood by turning to the following detailed description of the preferred embodiments which are presented as illustrated examples of the invention defined in the claims.

It is expressly understood that the invention as defined by the claims may be broader than the illustrated embodiments described below.

DETAILED DESCRIPTION OF THE INVENTION

Turning now to the accompanying figures, wherein like references define like elements among the several views, Applicant discloses a device, process and device made from a process, for providing a cap chip or high-density reroute layer for use in a three-dimensional microelectronic module comprising a stack of layers where one or more of the layers may comprise an integrated circuit chip. The layer device may, in an alternative embodiment, comprise one or more active electronic elements for performing a function within the module.

Figure 1A:
FIGS. 1A-1G depict a set of process steps for fabricating a cap chip of the invention for use in a stacked microelectronic module.

Turning now to FIGS. 1A-1G, a cap chip 100, which may be provided in the form of a high density reroute layer for use in a microelectronic module, and a process for making same is disclosed With respect to FIG. 1A, a sacrificial substrate 1 is provided. The sacrificial substrate material may be an FR-4 or polyimide glass material, or a metal material such as an aluminum or copper material, or be of any material of equivalent properties suitable for defining one or more layers of electrically conductive traces and insulative or dielectric layers on a major planar surface thereof.

Figure 1B:
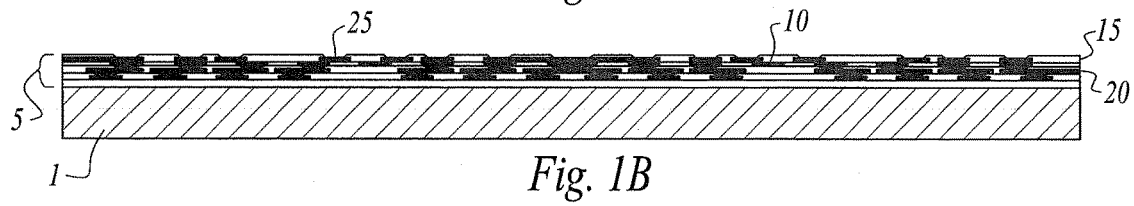

With respect to FIG. 1B, one or more first sets of electrically conductive reroute layers 5 comprising one or more sets of electrically conductive traces 10 and dielectric layers 15 are defined on a major surface of substrate 1 in a set of patterning, etching, coating, and plating processes as is known in the photolithographic and plating arts and as is generally disclosed in the aforementioned issued U.S. patents.

The invention contemplates any number of reroute layers in the first set of electrically conductive reroute layers 5, from one to any desired number, dependent upon the end use of the device.

In a preferred embodiment, first set of electrically conductive reroute layers 5 comprises one or more access leads 20, comprising cross-sections of an electrically conductive traces 10, exposed on a lateral surface of first reroute layers 5. Access leads 20 may be used for electrical coupling to one or more plated-on, electrically conductive traces defined on one or more lateral surface of the layer in the form of a T-connect structure in a separate fabrication operation.

The first set of electrically conductive reroute layers 5 comprises at least one exposed electrically conductive pad 25.

Figure 1C:
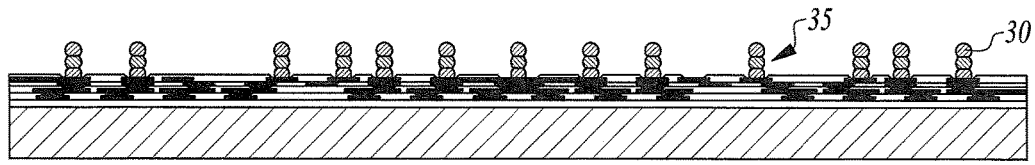

With respect to FIG. 1C, a predetermined number of wire bond balls or "stud bumps" 30, in the form of a stud bump column 35, are electrically coupled to exposed conductive pad 25 using, for instance, an industry-standard wire bonder such as available from West Bond, Inc.

Figure 1D:
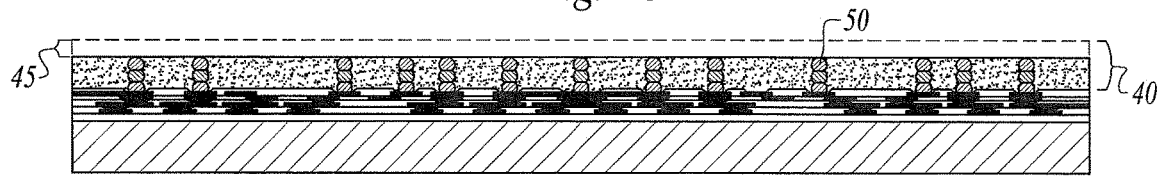

With respect to FIG. 1D, the surface of substrate 1 is coated in an encapsulation material 40 such that stud bump columns 35 are encapsulated. A suitable encapsulation material 40 is a silica-filled epoxy material. Encapsulation material 40 is cured per manufacturer specifications.

After curing, a predetermined portion 45 of encapsulation material 40 is removed to expose a portion of the stud bump column 35 to define an exposed stud bump column surface 50.

Figure 1E:
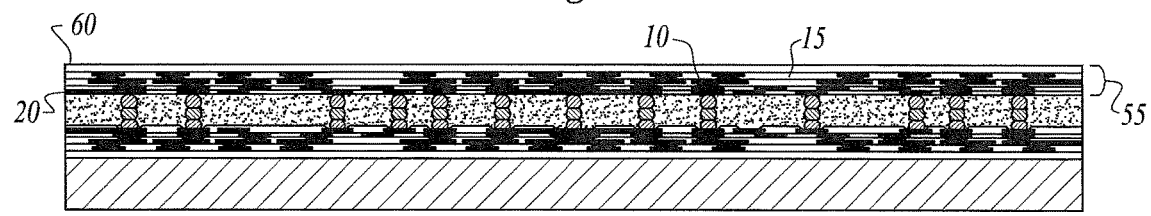

With respect to FIG. 1E, and in like manner to the fabrication of first set of electrically conductive reroute layers 5, one or more second sets of electrically conductive reroute layers 55 comprising one or sets of electrically conductive traces 10 and dielectric layers 15 are defined on the major surface of substrate 1 having stud bump column surface 50 defined thereon. Second set of electrically conductive reroute layers 55 are fabricated in a set of patterning, etching, coating and plating processes as is known in the photolithographic and plating arts and as is disclosed in the aforementioned issued U.S. patents.

The invention contemplates any number of electrically conductive reroute layers in the second set of reroute layers 55, from one to any desired number, dependent upon the end use of the device.

In a preferred embodiment, second set of electrically conductive reroute layers 55 comprises one or more access leads 20, comprising one or more cross-sections of electrically conductive traces 10 exposed on a lateral surface of second set of electrically conductive reroute traces 55. Access leads 20 may be used for electrical coupling to a plated-on, electrically conductive traces defined on one or more lateral surfaces of the module in the form of a T-connect structure in a separate fabrication operation.

A final dielectric layer 60 may be disposed over the second set of electrically conductive reroute traces 55.

Figure 1F:
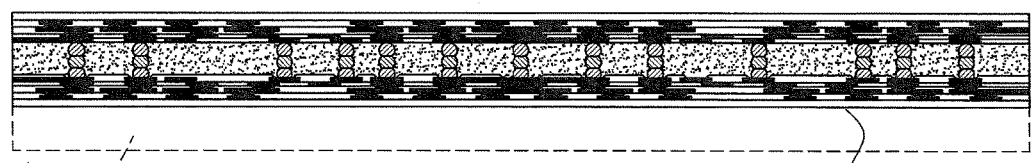

With respect to FIG. 1F, sacrificial substrate 1 is removed as by a grinding or lapping operation removing the sacrificial substrate to expose a reroute layer interconnect surface 65.

Figure 1G:
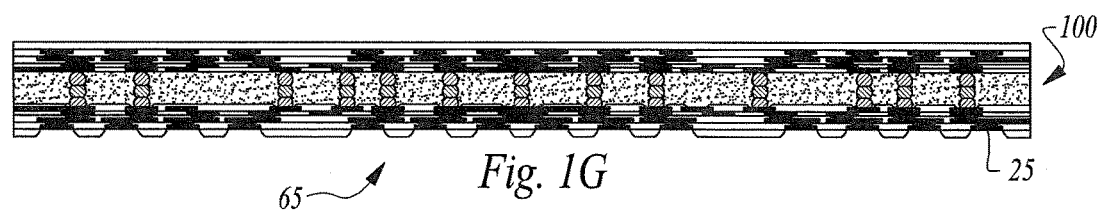

With respect to FIG. 1G, an exposed, electrically conductive pad 25 is defined on reroute layer interconnection surface 65 at one or more predetermined locations to define an electrically conductive surface for coupling device 100 to a layer, an external device or a printed circuit element using, for instance, a solder ball connection. If desired, one or more vias (not shown) may be defined in final dielectric layer 60 at one or more predetermined locations to permit electrical coupling of one or more conductive traces 10 in second reroute layers 55 to external circuitry or to provide a high density reroute layer 100 for use in a stacked microelectronic module.

Turning now to FIGS. 2A-H, an alternative embodiment of the cap chip or reroute layer device 100 of the invention is depicted comprising one or more active or passive circuit elements 200 which may comprise, for example, a prepackaged integrated circuit chip, a bare integrated circuit die, a discrete active or passive electronic element such as a resistor, capacitor, inductor, diode or equivalent device, or any combination thereof.

With respect to FIG. 2A, a sacrificial substrate 1 is provided. As above, the sacrificial substrate material may be an FR-4 or polyimide glass material, or a metal material such as an aluminum or copper material, or be of any material of equivalent properties suitable for defining one or more layers of electrically conductive traces and insulative or dielectric layers on a major planar surface thereof.

With respect to FIG. 2B, one or more first sets of electrically conductive reroute layers 5 comprising one or more sets of electrically conductive traces 10 and dielectric layers 15 are defined on a major surface of substrate 1 in a set of patterning, etching, coating and plating processes as is known in the photolithographic and plating arts and as is generally disclosed in the aforementioned issued U.S. patents.

This embodiment of the invention contemplates any number of reroute layers in the first set of electrically conductive reroute layers 5, from one to any desired number, dependent upon the end use of the device.

In this preferred embodiment, first set of electrically conductive reroute layers 5 comprises one or more access leads 20, comprising cross-sections of electrically conductive traces 10, exposed on a lateral surface of first electrically conductive reroute layer 5. Access leads 20 may be used for electrical coupling to one or more plated-on, electrically conductive traces defined on one or more lateral surfaces of the layer in the form of a T-connect structure in a separate fabrication operation.

First set of electrically conductive reroute layers 5 comprises at least one exposed electrically conductive pad 25.

With respect to FIG. 2C, a predetermined number of wire bond balls or "stud bumps" 30, in the form of one or more stud bump columns 35 are electrically coupled to exposed pad 25 using, for instance, an industry-standard wire bonder such as available from West Bond, Inc.

With respect to FIG. 2D, one or more active or passive electronic circuit elements, 200 are electrically coupled to one or more exposed electrically conductive pads 25. Circuit elements 200 may be electronically coupled to conductive pads 25 as is known in the electronic fabrication arts using thermo-sonic bonding, conductive epoxies, solder, wire bonding or any equivalent electronic coupling fabrication process.

Circuit elements 200 may comprise, by way of example and not limitation, bare integrated circuit die, packaged integrated circuit parts or discreet active or passive elements which may include a processing element such as a digital signal processor, microprocessor, field programmable gate array or electronic monitoring circuit element such as a secure supervisor chip.

As depicted in FIG. 2E, the surface of substrate 1 is coated in an encapsulation material 40 such that stud bump columns 35 are encapsulated. A suitable encapsulation material 40 is a silica-filled epoxy material having acceptable dielectric properties. After "potting" the layer, encapsulation material 40 is cured per manufacturer specifications. After curing, a predetermined portion 45 of encapsulation material 40 is removed to expose a portion of stud bump column 35 to define a stud bump column surface 50.

With respect to FIG. 2F, and in like manner to the fabrication of the first set of electrically conductive reroute layers 5, one or more second sets of electrically conductive reroute layers 55 comprising one or sets of electrically conductive traces 10 and dielectric layers 15 are defined on the major surface of substrate 1 having stud bump column surface 50 defined thereon. Second set of electrically conductive reroute layers 55 are fabricated in a set of patterning, etching, coating, and plating processes as is known in the photolithographic and plating arts and as is disclosed in the aforementioned issued U.S. patents.

The invention contemplates any number of electrically conductive reroute layers in the second set of reroute layers 55, from one to any desired number, dependent upon the end use of the device.

In a preferred embodiment, second set of electrically conductive reroute layers 55 comprises one or more access leads 20, comprising cross-sections of an electrically conductive trace 10 exposed on a lateral surface of the second set of reroute traces 55. Access lead 20 may be used for electrical coupling to a plated-on, electrically conductive trace defined on the lateral surface of the layer in the form of a T-connect structure in a separate fabrication operation.

A final dielectric layer 60 is disposed over second set of electrically conductive reroute traces 55.

With respect to FIG. 2G, sacrificial substrate 1 is removed as by a grinding or lapping operation to expose a reroute layer interconnect surface 65.

With respect to FIG. 2H, an exposed, electrically conductive pad 25 is defined on a conductive trace 10 on reroute layer interconnection surface 65 at a predetermined location for coupling device 100 to an adjacent layer, external device or printed circuit element using, for instance, a solder ball connection.

Turning now to FIGS. 3A-I, a yet further alternative embodiment of the cap chip or reroute layer device 100 of the invention is depicted comprising one or more active or passive circuit elements 200 which may comprise, for example a prepackaged integrated circuit chip, a bare integrated circuit die, a discrete active or passive electronic element such as a resistor, capacitor, inductor, diode or equivalent device, or any combination thereof.

Figure 3A:
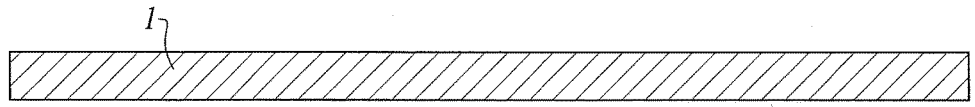
FIGS. 3A-3I depict a set of process steps for fabricating a high density reroute layer for use in a stacked microelectronic module of the invention comprising one or more electronic elements for use in a stacked microelectronic module.

With respect to FIG. 3A, a sacrificial substrate 1 is provided. As above, the sacrificial substrate material may be an FR-4 or polyimide glass material, or a metal material such as an aluminum or copper material, or be of any material of equivalent properties suitable for defining one or more layers of electrically conductive traces and insulative or dielectric layers on a major planar surface thereof.

Figure 3B:
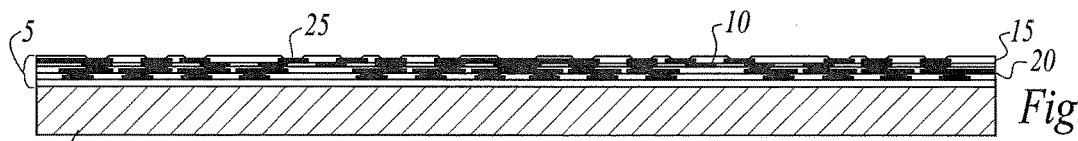

With respect to FIG. 3B, one or more first sets of electrically conductive reroute layers 5 comprising one or more sets of electrically conductive traces 10 and dielectric layers 15 are defined on a major surface of substrate 1 in a set of patterning, etching, coating and plating processes as is known in the photolithographic and plating arts and as is generally disclosed in the aforementioned issued U.S. patents.

This embodiment of the invention contemplates any number of electrically conductive reroute layers in first set of reroute layers 5, from one to any desired number, dependent upon the end use of the device.

In this preferred embodiment, first set of electrically conductive reroute layers 5 comprises one or more access leads 20, comprising one or more cross-sections of electrically conductive traces 10, exposed on one or more lateral surfaces of first reroute layer 5. Access leads 20 may be used for electrical coupling to one or more plated-on, electrically conductive traces defined on one or more lateral surfaces of the layer in the form of a T-connect structure in a separate fabrication operation.

First set of electrically conductive reroute layers 5 comprises at least one exposed electrically conductive pad 25.

Figure 3C:
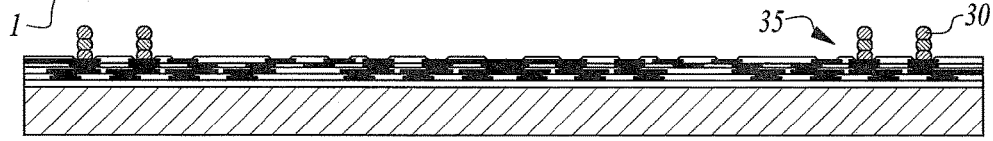

With respect to FIG. 3C, a predetermined number of wire bond balls or "stud bumps" 30, in the form of one or more stud bump columns 35, are electrically coupled to exposed conductive pad 25 using, for instance, an industry-standard wire bonder such as available from West Bond, Inc.

Figure 3D:
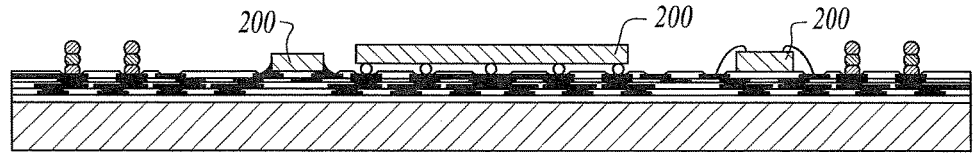

With respect to FIG. 3D, one or more active or passive electronic circuit elements 200 are electrically coupled to one or more exposed electrically conductive pads 25. Circuit elements 200 may be electrically coupled to conductive pads 25 as is known in the electronic fabrication arts using thermo-sonic bonding, conductive epoxies, solder, wire bonding or any equivalent electrical coupling fabrication process. Circuit elements 200 may comprise, by way of example and not limitation, bare integrated circuit die, packaged integrated circuit parts or discreet active or passive elements.

Circuit elements 200 may comprise a data processing element such as a digital signal processor, microprocessor, field programmable gate array or electronic tamper monitoring circuit element such as a secure supervisor chip.

Figure 3E:
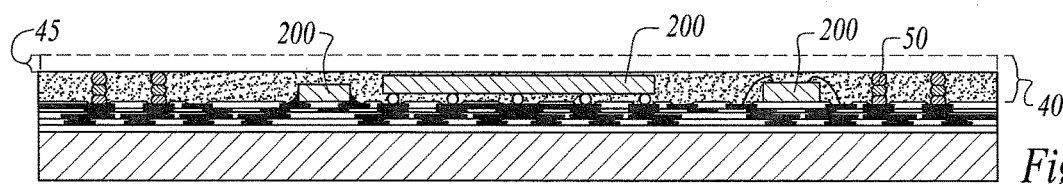

With respect to FIG. 3E, the surface of substrate 1 is coated in an encapsulation material 40 such that stud bump columns 35 are encapsulated. A suitable encapsulation material 40 is a silica-filled epoxy material having acceptable dielectric properties. After "potting" the layer, encapsulation material 40 is cured per manufacturer specifications. After curing, a predetermined portion 45 of encapsulation material 40 is removed to expose a portion of stud bump column 35 to define an exposed stud bump column surface 50.

Figure 3F:
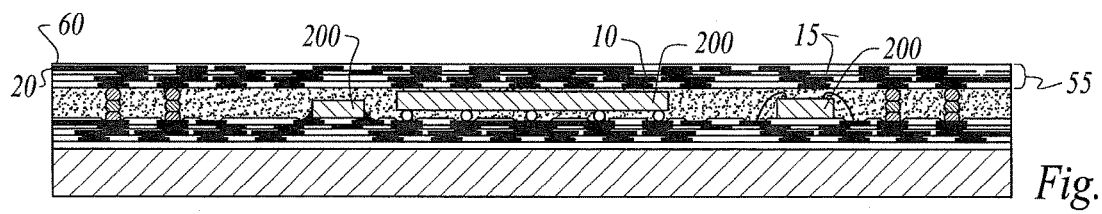

With respect to FIG. 3F, and in like manner to the fabrication of first set of electrically conductive reroute layers 5, one or more second sets of electrically conductive reroute layers 55 comprising one or sets of electrically conductive traces 10 and dielectric layers 15 are defined on the major surface of substrate 1 having stud bump column surface 50 defined thereon. Second sets of electrically conductive reroute layers 55 are fabricated in a set of patterning, etching, coating and plating processes as is known in the photolithographic and plating arts and as is disclosed in the aforementioned issued U.S. patents.

The invention contemplates any number of electrically conductive reroute layers in second set of reroute layers 55, from one to any desired number, dependent upon the end use of the device.

In this preferred embodiment, second set of electrically conductive reroute layers 55 comprises one or more access leads 20, comprising one or more cross-sections of electrically conductive traces 10 exposed on one or more lateral surfaces of second set of electrically conductive reroute traces 55. Access leads 20 may be used for electrical coupling one or more plated-on, electrically conductive traces defined on one or more lateral surfaces of the layer in the form of a T-connect structure in a separate fabrication operation.

A final dielectric layer 60 is disposed over second set of electrically conductive reroute traces 55.

Figure 3G:
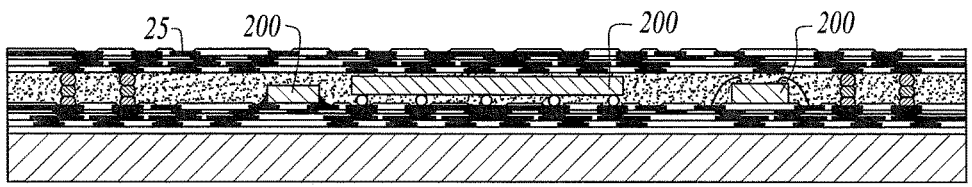

With respect to FIG. 3G, one or more openings or vias are defined in final dielectric layer 60 to define one or more exposed electrically conductive pads 25 on one or more electrically conductive traces 10.

Figure 3H:
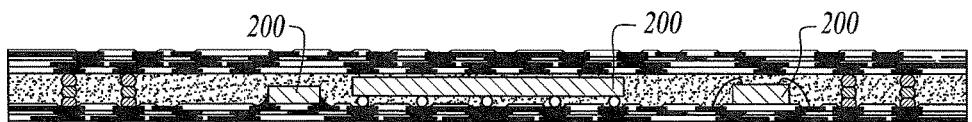

With respect to FIG. 3H, sacrificial substrate 1 is removed as by a grinding or lapping operation to expose a reroute layer interconnect surface 65.

Figure 3I:
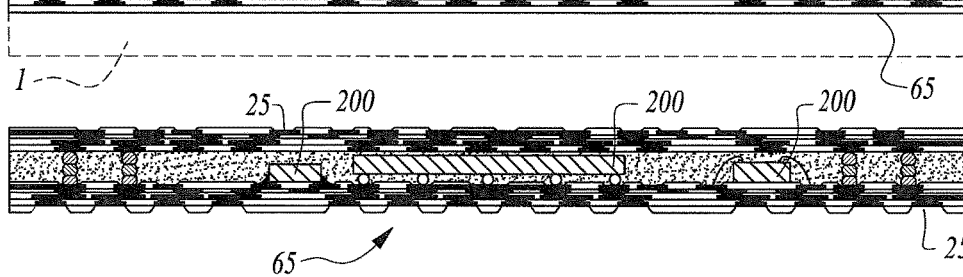

With respect to FIG. 3I, an exposed electrically conductive pad 25 is defined on reroute layer interconnection surface 65 at one or more predetermined locations for coupling device 100 to an adjacent layer, an external device or printed circuit element using, for instance, a solder ball connection.

The cap chip or reroute layer embodiments of FIGS. 3A-3I may desirably be incorporated as part of a tamper-resistant stacked microelectronic module having electronic tamper monitoring circuitry for use in electrically coupling the layers in a stack for monitoring tamper attempts and for rerouting, and thus obfuscating, the signals and signal traces in the module, or a combination of any of these.

For instance, electronic element 200 may comprise secure internal processing means such as a Maxim DS5250 high-speed secure microprocessor element, or a MAXQ or DS3640 Maxim device.

The Maxim DS3655 Secure Supervisor from Maxim Integrated Products, Inc. is well-suited for use as electronic element 200 as an electronic monitoring circuit for monitoring a protected module and provides tamper-detection comparator inputs that interface with and provide continuous, low-power monitoring of resistive anti-tamper resistive meshes, external sensors, and digital interlocks. The Maxim DS3655 device provides circuitry that monitors primary power and in the event of failure, an external or embedded storage capacitor or battery power source is switched in to keep the device and external circuitry active. The DS3655 also monitors battery voltage and initiates a tamper response such as erasure of the contents of a memory element in the module such as an encryption key when the battery voltage becomes abnormal or there is a predetermined temperature limit or rate of change that is exceeded.

When anti-tamper circuitry such as the Maxim devices above are configured to sense a predetermined event such as an open circuit, voltage or current change, temperature change or breach in an anti-tamper mesh, a tamper response may be configured to be generated such as zeroizion of the contents of a memory or the opening of a fuse element such as a FET switch.

By way of example and not by limitation, such tamper-resistant modules are disclosed in U.S. patent Ser. No. 12/806,127 entitled "Tamper-Resistant Electronic Circuit and Module Incorporating Electrically Conductive Nano-Structures", now pending, and U.S. patent Ser. No. 13/370,381 entitled "Anti-Tamper Wrapper Interconnect Method and Device", now pending, each of which is assigned to ISC8 Inc., assignee of the instant application and the contents of which are fully incorporated herein.

A tamper-resistant module incorporating the cap chip or reroute layer 100 of the invention may comprise a stack of layers wherein at least two of the layers each comprise at least one integrated circuit chip, and wherein at least one of the layers comprises an electronic monitoring circuit or an electrically conductive structure having a predetermined electrical characteristic that is in electrical connection with the electronic monitoring circuit.

The electronic monitoring circuit is configured whereby a predetermined sensed variance in the predetermined electrical characteristic initiates a predetermined response from the monitoring circuit. The predetermined response may comprise the zeroization of the contents of a memory, the opening of an internal fuse, or the reconfiguration of one or more I/O in the module. The sense variance may comprise a change in a voltage or current, a change in resistance, capacitance or inductance, a change in temperature or time or the sense of a breach in an anti-tamper wrapper element.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a sub combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A reroute layer device prepared by a process comprising the steps of:
   providing a sacrificial substrate comprising a substrate surface,
   defining a first set of electrically conductive reroute layers comprising at least one exposed electrically conductive pad on the substrate surface,
   electrically coupling to the exposed pad a predetermined plural number of wire bond stud bumps deposited by a wire bonder in the form of a stud bump column,
   encapsulating the layer within an encapsulation material,
   removing a predetermined portion of the encapsulation material to expose a portion of the stud bump column to define a stud bump column surface,
   defining a second set of electrically conductive reroute layers electrically coupled to the stud bump column on the stud bump column surface,
   removing the sacrificial substrate to expose a reroute layer interconnect surface, and,
   exposing an electrically conductive pad on the reroute layer interconnection surface.

2. The device of claim 1 wherein the outermost layer of the second set of electrically conductive reroute layers is a uniform dielectric layer.

3. The device of claim 1 wherein the outermost layer of the second set of electrically conductive reroute layers comprises at least one exposed conductive pad.

4. The device of claim 1 wherein the process further comprises the step of electrically coupling an electronic element to at least one of the first or second set of electrically conductive reroute layers.

5. The device of claim 4 wherein the electronic element comprises an electronic monitoring circuit.

6. A reroute layer device comprise of:
   a first set of electrically conductive reroute layers,
   a second set of electrically conductive reroute layers, and,
   at least one encapsulated stud bump column formed of a plurality of wire bond stud bumps, defined between and electrically coupled to the first set of electrically conductive reroute layers and the second set of electrically conductive reroute layers.

7. The reroute device of claim 6 further wherein at least one of the first and second reroute layers comprises an access lead defined on a lateral surface of the device.

8. The device of claim 6 wherein the outermost layer of the second set of electrically conductive reroute layers is a uniform dielectric layer.

9. The device of claim 6 wherein the outermost layer of the second set of electrically conductive reroute layers comprises at least one exposed conductive pad.

10. The device of claim 6 further comprising an electronic element coupled to at least one of the first or second set of electrically conductive reroute layers.

11. The device of claim 10 wherein the electronic element comprises an electronic monitoring circuit.

* * * * *